United States Patent [19]

Mori

[11] Patent Number: 5,453,634
[45] Date of Patent: Sep. 26, 1995

[54] NON-VOLATILE SEMICONDUCTOR DEVICE

[75] Inventor: Seiichi Mori, Tokyo, Japan

[73] Assignee: Kabushiki Kaisha Toshiba, Kanagawa, Japan

[21] Appl. No.: 196,786

[22] Filed: Feb. 15, 1994

Related U.S. Application Data

[63] Continuation of Ser. No. 565,165, Aug. 10, 1990, abandoned, which is a continuation of Ser. No. 281,739, Dec. 9, 1988, abandoned.

[30] Foreign Application Priority Data

Dec. 21, 1987 [JP] Japan ................... 62-323084

[51] Int. Cl.⁶ .................................. H01L 29/34
[52] U.S. Cl. ................ 257/316; 257/640; 257/647
[58] Field of Search ............................. 257/640

[56] References Cited

U.S. PATENT DOCUMENTS

| | | | |
|---|---|---|---|
| 4,271,582 | 6/1981 | Shirai et al. | 357/54 |
| 4,364,167 | 12/1982 | Douley | 437/43 |
| 4,455,568 | 12/1984 | Shiota | 357/54 |
| 4,642,881 | 2/1987 | Matuskawa | 437/43 |
| 4,665,426 | 5/1987 | Allen et al. | 357/54 |
| 4,789,560 | 12/1988 | Yen | 257/640 |

FOREIGN PATENT DOCUMENTS

| | | | |
|---|---|---|---|
| 55-44742 | 3/1980 | Japan . | |
| 0030846 | 3/1980 | Japan | 437/52 |
| 0050771 | 3/1983 | Japan | 437/43 |
| 60-210851 | 10/1985 | Japan | 357/54 |
| 0154175 | 7/1986 | Japan | 437/52 |
| 0225871 | 10/1986 | Japan | 437/52 |
| 0290771 | 12/1986 | Japan | 437/52 |
| 0073774 | 4/1987 | Japan | 437/52 |
| 62-188375 | 8/1987 | Japan | 257/640 |
| 63-288047 | 11/1988 | Japan | 257/640 |

OTHER PUBLICATIONS

"Nitride Sidewall Spacers Used on a Contamination Barrier", *IBM Technical Discolsure Bulletin*, vol. 30 (Jan. 1988) pp. 295–296.

Primary Examiner—J. Carroll
Attorney, Agent, or Firm—Finnegan, Henderson, Farabow, Garrett & Dunner

[57] ABSTRACT

A memory coil section, formed on a semiconductor substrate and including a floating gate and a control gate, for storing a charge in a non-volatile semiconductor device is covered with a silicon nitride layer. The periphery of a contact hole for allowing contact between a wiring layer and the substrate is also covered with a silicon nitride layer.

2 Claims, 3 Drawing Sheets

NON-VOLATILE SEMICONDUCTOR DEVICE

This application is a continuation of application Ser. No. 07/565,165, filed Aug. 10, 1990, now abandoned, which is a continuation of application Ser. No. 07/281,739, filed Dec. 9, 1988, now abandoned.

BACKGROUND OF THE INVENTION

1. Field of the Invention

This invention concerns a non-volatile semiconductor device constituting a non-volatile semiconductor memory, especially an EPROM (Erasable PROM) and an EEPROM (Electrical Erasable PROM).

2. Description of the Prior Art

In general, mobile ions in a device cause deterioration of the charge retention characteristics and instability of the threshold voltage of the device.

Recently, non-volatile memories have been used in various fields and occasionally under relatively high temperature conditions. Thus, it is required to restrict the amount of mobile ions in the device to as small an amount as possible.

Conventionally, mobile ions such as sodium ions $Na^+$, which adhere to a wafer during wafer processing, are fixed in a PSG (Phospho-Silicate Glass) layer used in a gettering process. For example, as shown in FIG. 1, a PSG layer 6 is formed on an oxide layer 5, and a high temperature treatment is carried out. In the temperature treatment, mobile ions adhered to the wafer move into the PSG layer 6, and are fixed therein. Furthermore, the PSG layer 6 acts to prevent invasion of mobile ions from the exterior.

However, in the conventional device, the invasion of mobile ions from the contact hole 7 for e.g., a source region 8 to a memory cell section 2 having a floating gate electrode 3 and a control gate electrode 4, can not be avoided. This occurs because the contact hole 7 is formed after the gettering process, and the oxide layer 5 does not act as a barrier layer against the invasion of the mobile ions, since the mobile ions move in the oxide layer. Furthermore, after the formation of the contact hole, there is no processing step performed at high temperatures. Thus, the mobile ions are not fixed in the PSG layer 6. Therefore, in the latest LSI devices, the invasion of mobile ions is mainly caused by the contact hole.

SUMMARY OF THE INVENTION

Therefore an object of this invention is to prevent the invasion of mobile ions from a contact hole, and to provide a non-volatile semiconductor device having high reliability.

To achieve the above object, this invention provides a non-volatile semiconductor device having a memory cell for storing a charge, formed on a semiconductor substrate, and a contact hole for allowing contact between a wiring layer and the substrate, wherein the memory cell and the periphery of the contact hole are covered with a silicon nitride layer.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings.

DETAILED DESCRIPTION OF THE INVENTION

Figure 2:
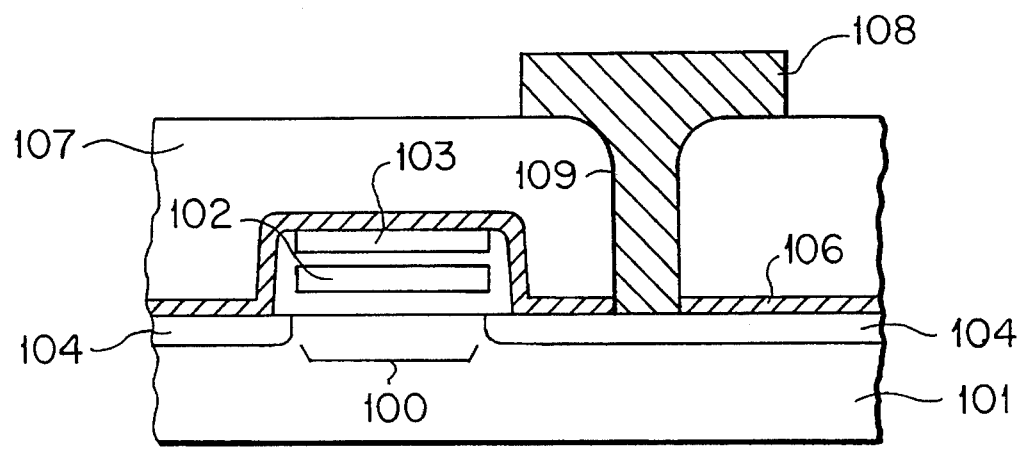
FIG. 2 is a cross sectional view of a preferred embodiment of this invention.
Figure 3:
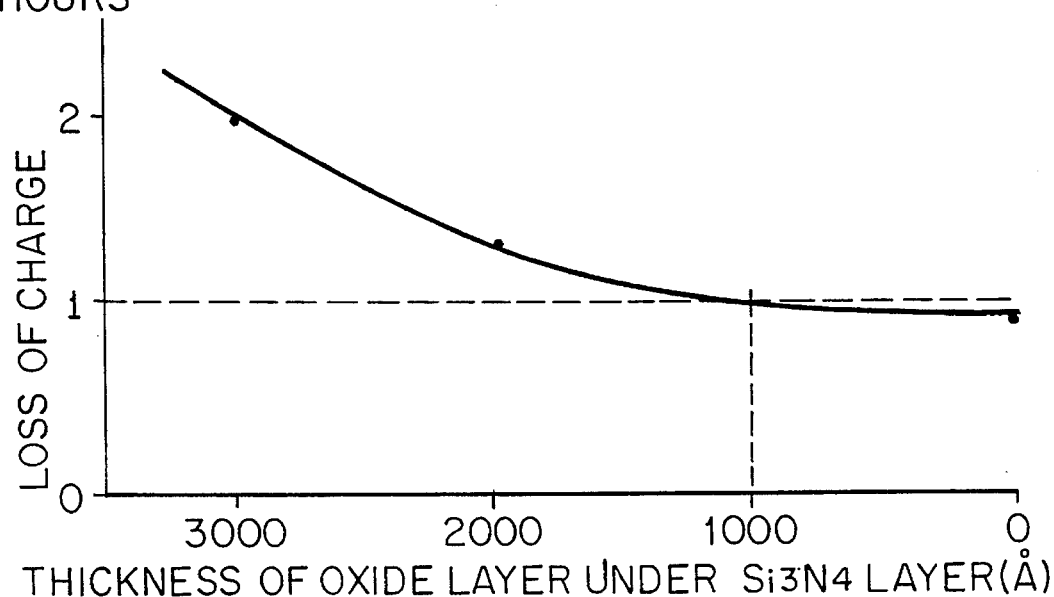
FIG. 3 is a characteristic curve showing the relationship between the thickness of an oxide layer under the silicon nitride layer and the charge loss or charge retention characteristics.

Referring now to FIG. 2, there is illustrated a cross sectional view of a preferred embodiment of this invention.

In FIG. 2, numeral 101 is a semiconductor substrate of first conductivity type, e.g., P-type. Numeral 104 designates diffused regions for source and drain regions of second conductivity type, e.g., N-type. Numeral 106 designates a silicon nitride ($Si_3N_4$) layer formed on the substrate 101. Numerals 102 and 103 designate a floating gate electrode and a control gate electrode, respectively. Numeral 107 designates a PSG layer, and 109 is a contact hole penetrating the PSG layer 107 and the silicon nitride layer 106. Numeral 108 designates a metal wiring layer formed within the contact hole 109, and which contacts with the region 104.

As shown in FIG. 2, in accordance with this invention, the periphery of the contact hole 109 and the memory cell section 100 including the floating gate electrode 102 and the control gate electrode 103 are covered with the silicon nitride layer 106. Since the silicon nitride layer does not permit the passing of mobile ions, it is possible to prevent the invasion of mobile ions from the contact hole to the memory cell section 100.

Figure 1:
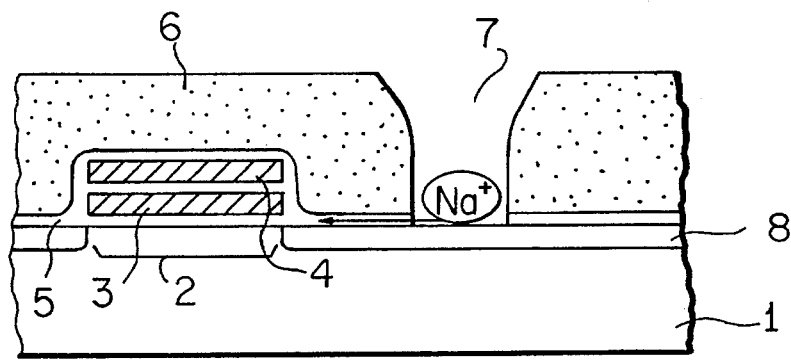
FIG. 1 is a cross sectional view of a conventional EPROM cell.

The EPROM device of FIG. 2 is manufactured as shown in FIGS. 4A to 4H. At first, a semiconductor substrate 101 of first conductivity, e.g., P-type is prepared, and an oxidation process is carried out to form an oxide layer 110 of about 200 Å (FIG. 1A).

Figure 4A:
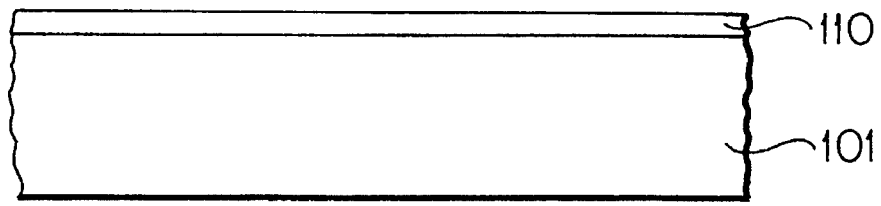
FIGS. 4A to 4H are cross sectional views showing the steps for manufacturing the embodiment of FIG. 2.
Figure 4B:
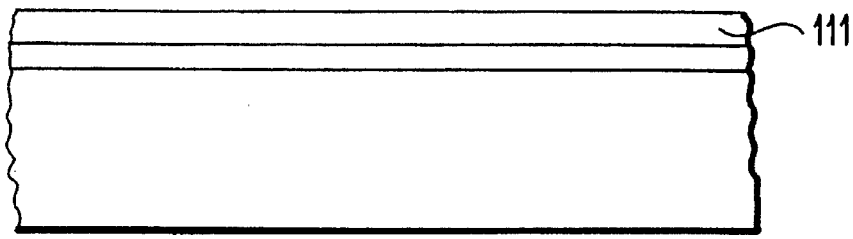
Figure 4C:
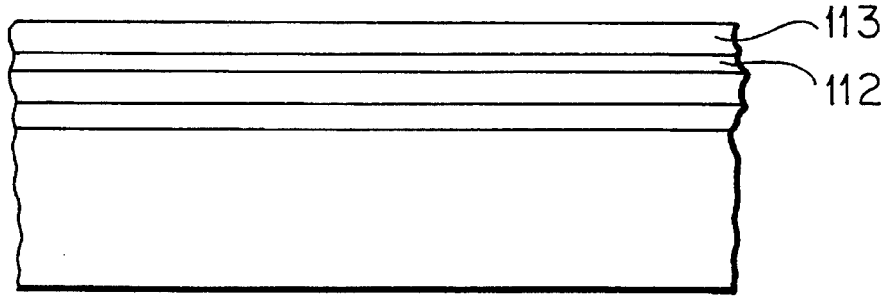

Next, a polycrystalline silicon layer 111 of about 4000 Å doped with ,e.g., phosphorus in a concentration of 2 to $5 \times 10^{20}$ $cm^{-3}$ is formed on the oxide layer 110 (FIG. 4B).

Figure 4D:
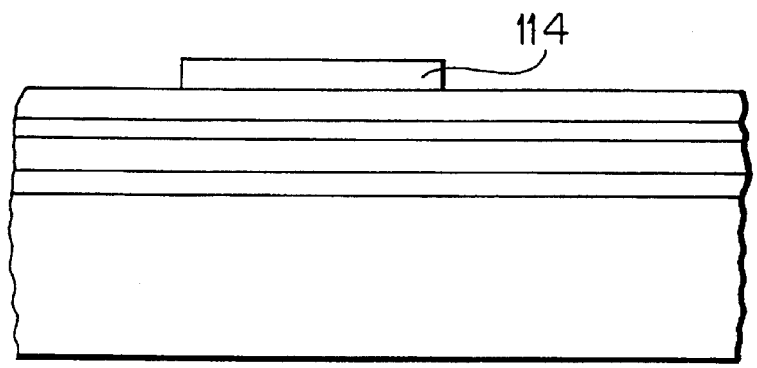

Then, an insulating layer 112 made of an oxide layer, or a multi-layer composed of an oxide layer-silicon nitride layer-oxide layer, is formed on the polycrystalline layer 111. For example, the oxide layer is formed by an oxidation treatment of the polycrystalline layer 111. In the case where a multi-layer is used, oxidation of the polycrystalline layer 111, deposition of the silicon nitride layer by LPCVD (Low Pressure CVD), and thermal oxidation for the top oxide layer are carried out. Then, a polycrystalline layer 113 of about 4000 Å, doped with phosphorus at 5 to $6 \times 10^{20}$ $cm^{-3}$, is deposited. Then, a patterned photo resist mask 114 is formed on the polycrystalline layer 113 (FIG. 4D).

Figure 4E:
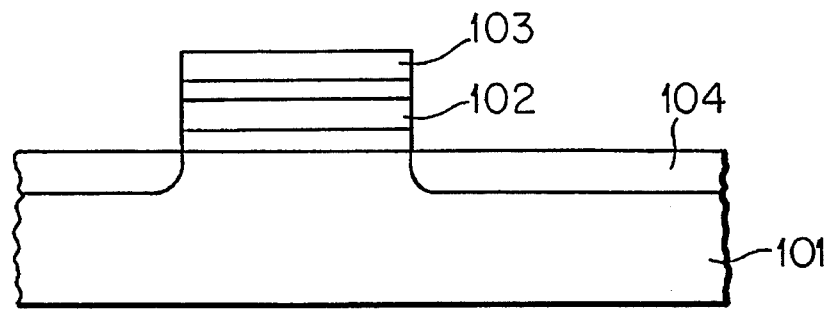

Next, RIE (Reactive Ion Etching) is carried out using the resist layer 114 as a mask, to expose the substrate. After removal of the resist layer 114, arsenic is introduced by ion implantation in a dose of $5 \times 10^{15}$ $cm^{-2}$ using the remaining polycrystalline layer 103 as a mask, to form source and drain regions 104 (FIG. 4E).

Figure 4F:
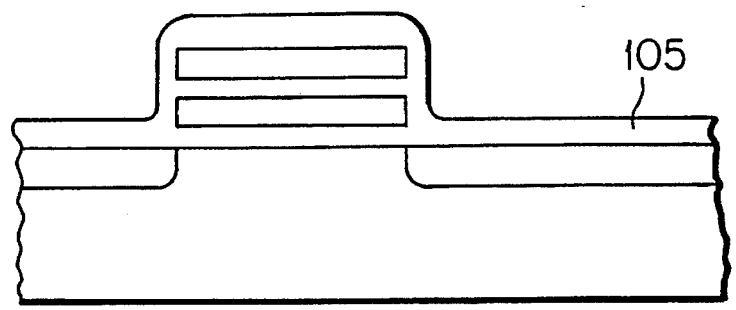
Figure 4G:
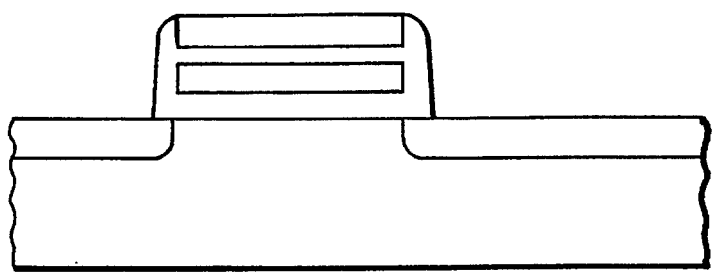

Next, thermal oxidation is carried out to form oxide layer 105 (FIG. 4F). Then, an etch back using the RIE method is carried out to remove the oxide layer 105 formed on the source and drain regions 104 (FIG. 4G).

Figure 4H:
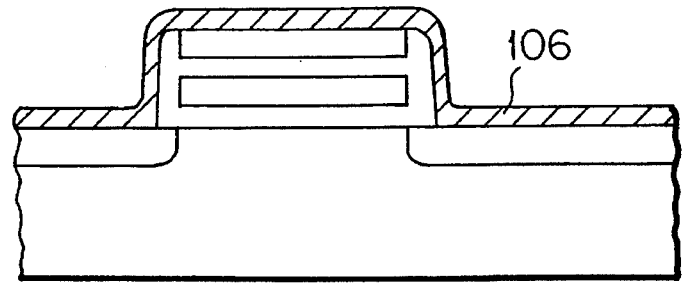

Next, silicon nitride layer 106 of e.g., 200 Å thickness is deposited by LPCVD (FIG. 4H). Finally, a PSG layer is formed as an interlayer, and a contact hole penetrating the PSG layer and the silicon nitride layer 106 is formed. After that, a metal wiring layer is formed as shown in FIG. 2.

In the predescribed embodiment, the oxide layer on the source and drain regions is completely removed.

Although the invention has been described in terms of an EPROM, it will be understood that this invention is applicable to any type of non-volatile memory, such as EEPROM, wherein the charge retention or information retention may be effected due to mobile ions.

Furthermore, the silicon nitride layer may be formed by other methods, such as plasma nitrization, or nitrization by thermal treatment, to change the oxide layer to a nitride layer by substituting the oxygen of the oxide layer for nitrogen. In the case where the substitution of the oxygen for the nitrogen is insufficient, an oxi-nitride (SiNO) layer may be produced. However, in such case, an improvement compared to the $SiO_2$ layer is expected.

Any thickness of the silicon nitride layer can be used, as long as the thickness is sufficient to prevent the invasion of the mobile ions.

The present invention has been described with respect to a specific embodiment. However, other embodiments based on the principles of the present invention should be obvious to those of ordinary skill in the art. Such embodiments are intended to be covered by the claims.

What is claimed is:

1. A non-volatile semiconductor device having a memory cell for storing a charge, the semiconductor device comprising:

a semiconductor substrate of a first conductivity type;

a source region and a drain region of a second conductivity type formed within the semiconductor substrate, the source and drain regions being spaced apart from one another so as to define a channel region between the source region and the drain region at a surface of the semiconductor substrate;

a memory cell section formed on the channel region of the semiconductor substrate, the memory cell section including a floating gate electrode and a control electrode insulated by an oxide layer;

a silicon nitride layer covering said memory cell section, the silicon nitride layer further covering and directly in contact with the surface of the source and drain regions without the oxide layer disposed therebetween;

an internal layer formed on the silicon nitride layer;

a contact hole penetrating the internal layer and the silicon nitride layer so as to expose a portion of the surface of the source region or drain region; and a wiring layer formed within the contact hole, the wiring layer contacting the surface of the source region or drain region.

2. The non-volatile semiconductor device of claim 1, wherein the silicon nitride layer surrounds the contact hole, and directly contacts the surface of the semiconductor substrate.

* * * * *